US010103560B2

(12) United States Patent
Chen et al.

(10) Patent No.: US 10,103,560 B2
(45) Date of Patent: Oct. 16, 2018

(54) CHARGER WITH WIDE RANGE OUTPUT VOLTAGE

(71) Applicant: Chicony Power Technology Co., Ltd., New Taipei (TW)

(72) Inventors: Chien-Hung Chen, New Taipei (TW); Chao-Ching Hsu, New Taipei (TW); Chih-Feng Shen, New Taipei (TW); Chung-Shu Lee, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 91 days.

(21) Appl. No.: 15/449,325

(22) Filed: Mar. 3, 2017

(65) Prior Publication Data
US 2018/0166899 A1   Jun. 14, 2018

(30) Foreign Application Priority Data

Dec. 12, 2016   (TW) .............................. 105141088 A

(51) Int. Cl.
*H02J 7/00* (2006.01)
*G01R 19/165* (2006.01)
*G01R 31/36* (2006.01)
*H02J 7/02* (2016.01)

(52) U.S. Cl.
CPC ...... *H02J 7/0052* (2013.01); *G01R 19/16542* (2013.01); *G01R 31/362* (2013.01); *H02J 7/025* (2013.01); *H02J 2007/0059* (2013.01)

(58) Field of Classification Search
CPC ..................................................... H02J 7/025

USPC ........................................................ 320/108
See application file for complete search history.

(56) References Cited

U.S. PATENT DOCUMENTS

| 5,675,484 A | 10/1997 | Shimada | |
|---|---|---|---|
| 6,836,095 B2 | 12/2004 | Fogg | |
| 2009/0067207 A1* | 3/2009 | Nishino | .................. B60L 5/005 363/126 |
| 2012/0153866 A1* | 6/2012 | Liu | .................... H02M 3/33561 315/294 |

FOREIGN PATENT DOCUMENTS

| CN | 102224665 A | 10/2011 |
|---|---|---|
| CN | 101777840 B | 6/2012 |
| CN | 104065149 A | 9/2014 |

(Continued)

*Primary Examiner* — Edward Tso
*Assistant Examiner* — Ahmed Omar
(74) *Attorney, Agent, or Firm* — Muncy, Geissler, Olds & Lowe, P.C.

(57) ABSTRACT

A charger with a wide range output voltage includes a voltage output side, a first constant voltage output unit, a voltage modulation unit and a load voltage detection unit. The first constant voltage output unit generates a first constant voltage. The load voltage detection unit detects a load voltage and transmits the load voltage to the voltage modulation unit. According to the load voltage and a load charging voltage requirement, the voltage modulation unit generates a modulation voltage and transmits the modulation voltage to the first constant voltage output unit. The first constant voltage output unit transmits the first constant voltage and the modulation voltage to the voltage output side. Moreover, the modulation voltage is an n times of a second constant voltage. The n is a positive number.

8 Claims, 7 Drawing Sheets

(56) References Cited

FOREIGN PATENT DOCUMENTS

| | | | |
|---|---|---|---|
| CN | 105006968 | A | 10/2015 |
| JP | H09201050 | A | 7/1997 |
| JP | 2014011925 | A | 1/2014 |
| JP | 2015042067 | A | 3/2015 |
| TW | 291624 | B | 11/1996 |
| TW | 201023487 | A | 6/2010 |
| TW | 201543784 | A | 11/2015 |

* cited by examiner

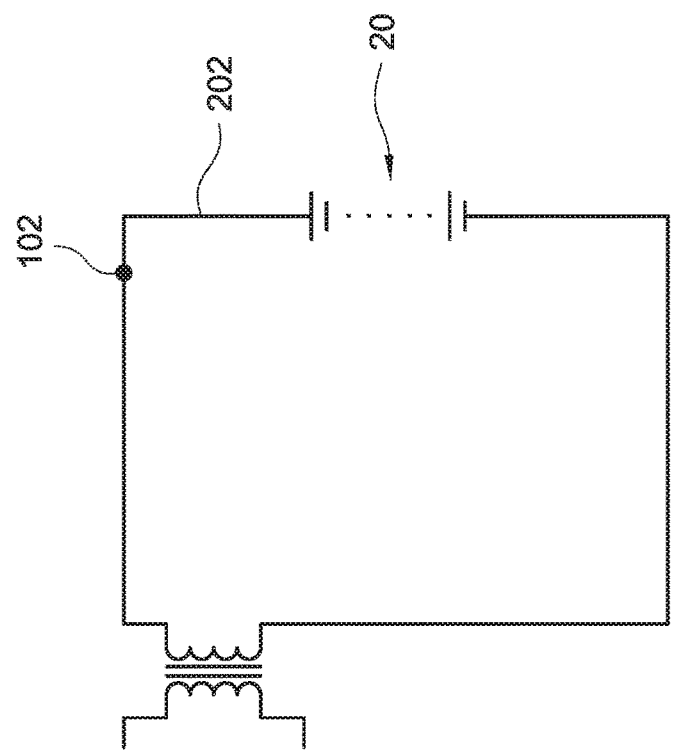

CHARGER WITH WIDE RANGE OUTPUT VOLTAGE

BACKGROUND OF THE INVENTION

Field of the Invention

The present invention relates to a charger, and especially relates to a charger with a wide range output voltage.

Description of the Related Art

FIG. 7 shows a circuit diagram of a part of an embodiment of the related art charger. The related art charger is used to charge a load 20. The load 20 is, for example but not limited to, a battery module. The charger mentioned above receives an alternating current voltage and converts the alternating current voltage into an output direct current voltage 202, and then sends the output direct current voltage 202 to the load 20 through a voltage output side 102 to charge the load 20.

Moreover, first a bridge rectifier rectifies the alternating current voltage to obtain a rectified voltage. If an output power of the charger mentioned above is greater than, for example, 75 watts, a power factor correction circuit processes the rectified voltage. Finally, a main isolating transformer outputs the output direct current voltage 202 to the load 20 to charge the load 20.

Moreover, a range of the output direct current voltage 202 is between the lowest voltage of the battery and the designed constant voltage. For example, if the voltage specification of the battery is 9 volts, the range of the output direct current voltage 202 is between 6 volts and 9 volts. The disadvantage of the charger mentioned above is that the range of the output direct current voltage 202 is too narrow (namely too small), so that the application range of the charger which has been manufactured is narrow (namely small). For example, the charger mentioned above cannot charge the battery with the low voltage specification or the battery with the high voltage specification.

SUMMARY OF THE INVENTION

In order to solve the above-mentioned problems, an object of the present invention is to provide a charger with a wide range output voltage.

In order to achieve the object of the present invention mentioned above, the charger includes a voltage output side, a first constant voltage output unit, a voltage modulation unit and a load voltage detection unit. The first constant voltage output unit is electrically connected to the voltage output side. The first constant voltage output unit generates a first constant voltage. The voltage modulation unit is electrically connected to the first constant voltage output unit. The load voltage detection unit is electrically connected to the voltage output side, the first constant voltage output unit and the voltage modulation unit. The load voltage detection unit detects a load voltage and transmits the load voltage to the voltage modulation unit. Moreover, according to the load voltage and a load charging voltage requirement, the voltage modulation unit generates a modulation voltage and transmits the modulation voltage to the first constant voltage output unit. The first constant voltage output unit transmits the first constant voltage and the modulation voltage to the voltage output side. Moreover, the modulation voltage is an n times of a second constant voltage. The n is a positive number.

Moreover, the charger mentioned above further comprises a second constant voltage output unit electrically connected to the voltage modulation unit to supply the second constant voltage to the voltage modulation unit.

Moreover, in the charger mentioned above, the second constant voltage output unit is an alternating-current-to-direct-current power conversion circuit receiving an external alternating current power, or the second constant voltage output unit is an external direct current power.

Moreover, in the charger mentioned above, the second constant voltage output unit is a power conversion circuit receiving an internal alternating current power.

Moreover, in the charger mentioned above, the voltage modulation unit is a buck-boost circuit.

Moreover, in the charger mentioned above, the load voltage detection unit comprises a control unit. According to the load charging voltage requirement, the control unit controls the voltage modulation unit to generate the modulation voltage.

Moreover, the charger mentioned above further comprises a control unit electrically connected to the voltage modulation unit and the load voltage detection unit. Moreover, the load informs the control unit of the load charging voltage requirement through the load voltage detection unit. According to the load charging voltage requirement, the control unit controls the voltage modulation unit to generate the modulation voltage.

Moreover, in the charger mentioned above, a range of the n is between 0.1 and 10.

The advantage of the present invention is that the output voltage of the charger is a wide range voltage, so that the application range of the charger becomes wide (namely big).

BRIEF DESCRIPTION OF DRAWING

FIG. 7 shows a circuit diagram of a part of an embodiment of the related art charger.

DETAILED DESCRIPTION OF THE INVENTION

Please refer to following detailed description and figures for the technical content of the present invention. The figures and detailed description are just for references but the present invention is not limited to it.

Figure 1:
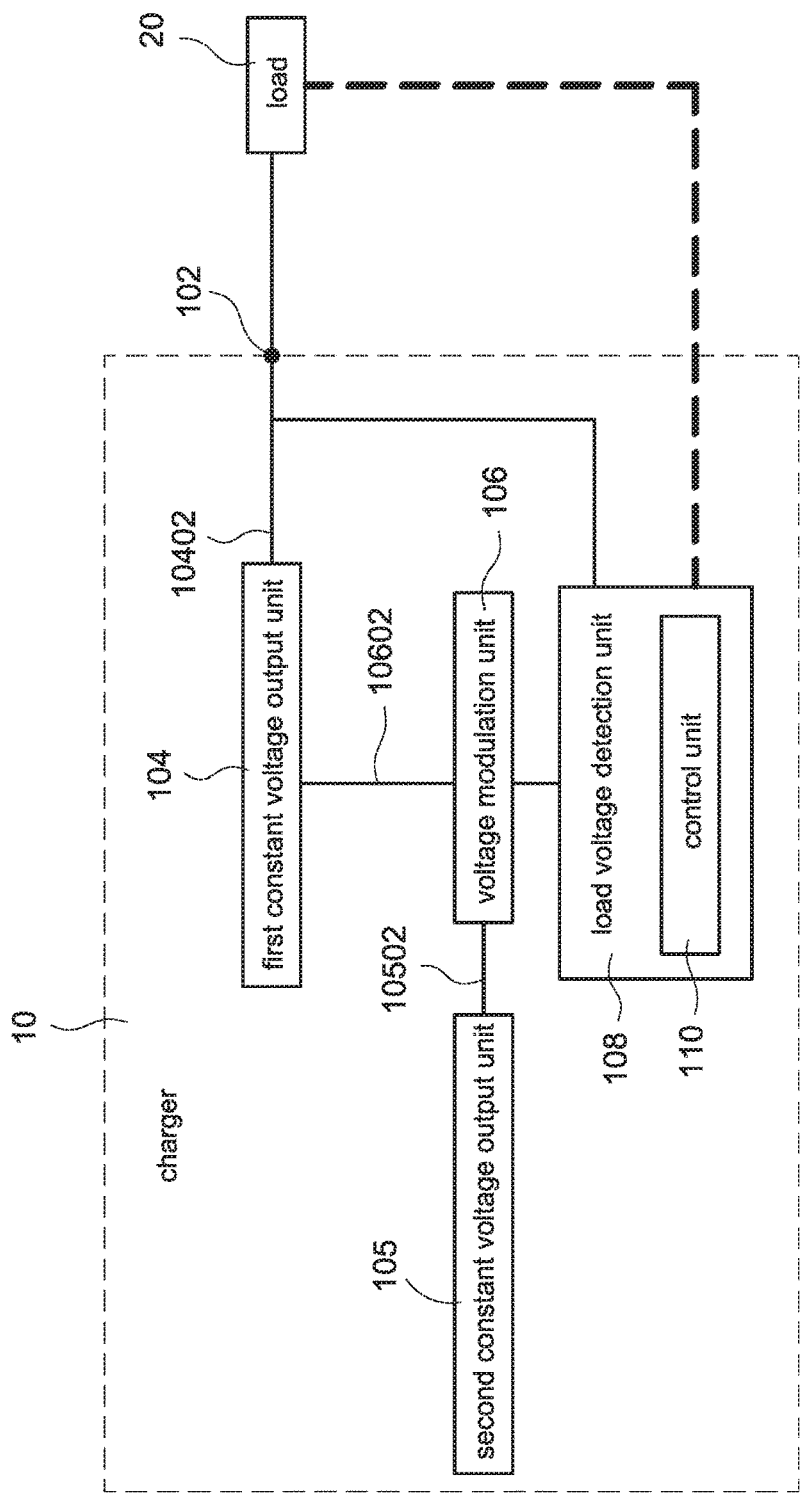
FIG. 1 shows a block diagram of the first embodiment of the charger with the wide range output voltage of the present invention.

FIG. 1 shows a block diagram of the first embodiment of the charger with the wide range output voltage of the present invention. A charger 10 with a wide range output voltage is used to charge a load 20. The charger 10 includes a voltage output side 102, a first constant voltage output unit 104, a voltage modulation unit 106, a second constant voltage output unit 105 and a load voltage detection unit 108. The load voltage detection unit 108 comprises a control unit 110. The voltage modulation unit 106 is electrically connected to the first constant voltage output unit 104, the second constant voltage output unit 105, the load voltage detection unit 108 and the control unit 110. The voltage output side 102 is electrically connected to the first constant voltage output unit 104, the load voltage detection unit 108, the control unit 110 and the load 20. The load 20 is further electrically connected to the load voltage detection unit 108 and the control unit 110. In FIG. 1, the dash line between the load 20 and the load voltage detection unit 108 is the signal line.

Following content describes the main technical features of FIG. 1 of the present invention:

First, the load voltage detection unit 108 detects a load voltage of the load 20 and transmits the load voltage of the load 20 to the voltage modulation unit 106 (namely, the load voltage detection unit 108 informs the voltage modulation unit 106 of the load voltage of the load 20), and the load 20 informs the control unit 110 of a load charging voltage requirement of the load 20 through the load voltage detection unit 108. So far, the voltage modulation unit 106 is aware of the load voltage of the load 20, and the control unit 110 is aware of the load charging voltage requirement of the load 20.

The second constant voltage output unit 105 supplies a second constant voltage 10502 to the voltage modulation unit 106. According to the load voltage of the load 20 and the load charging voltage requirement of the load 20, the control unit 110 controls the voltage modulation unit 106 to utilize the second constant voltage 10502 to generate a modulation voltage 10602 and the modulation voltage 10602 is transmitted to the first constant voltage output unit 104. The first constant voltage output unit 104 is used to generate a first constant voltage 10402. Finally, the first constant voltage output unit 104 serially adds (namely, superposition; utilizing the superposition theorem) the modulation voltage 10602 to the first constant voltage 10402 to send (the first constant voltage 10402 and the modulation voltage 10602) to the voltage output side 102 to charge the load 20 (namely, the load 20 receives the first constant voltage 10402 and the modulation voltage 10602 through the voltage output side 102, so that the load 20 is charged by the charger 10).

Moreover, the modulation voltage 10602 is an n times of the second constant voltage 10502. The n is a positive number. For example but not limited to, a range of the n is between 0.1 and 10. The second constant voltage output unit 105 is, for example but not limited to, an alternating-current-to-direct-current power conversion circuit receiving an external alternating current power, or the second constant voltage output unit 105 is an external direct current power, or the second constant voltage output unit 105 is a power conversion circuit receiving an internal alternating current power. The voltage modulation unit 106 is, for example but not limited to, a buck-boost circuit. The load 20 is, for example but not limited to, a battery module.

Figure 2:
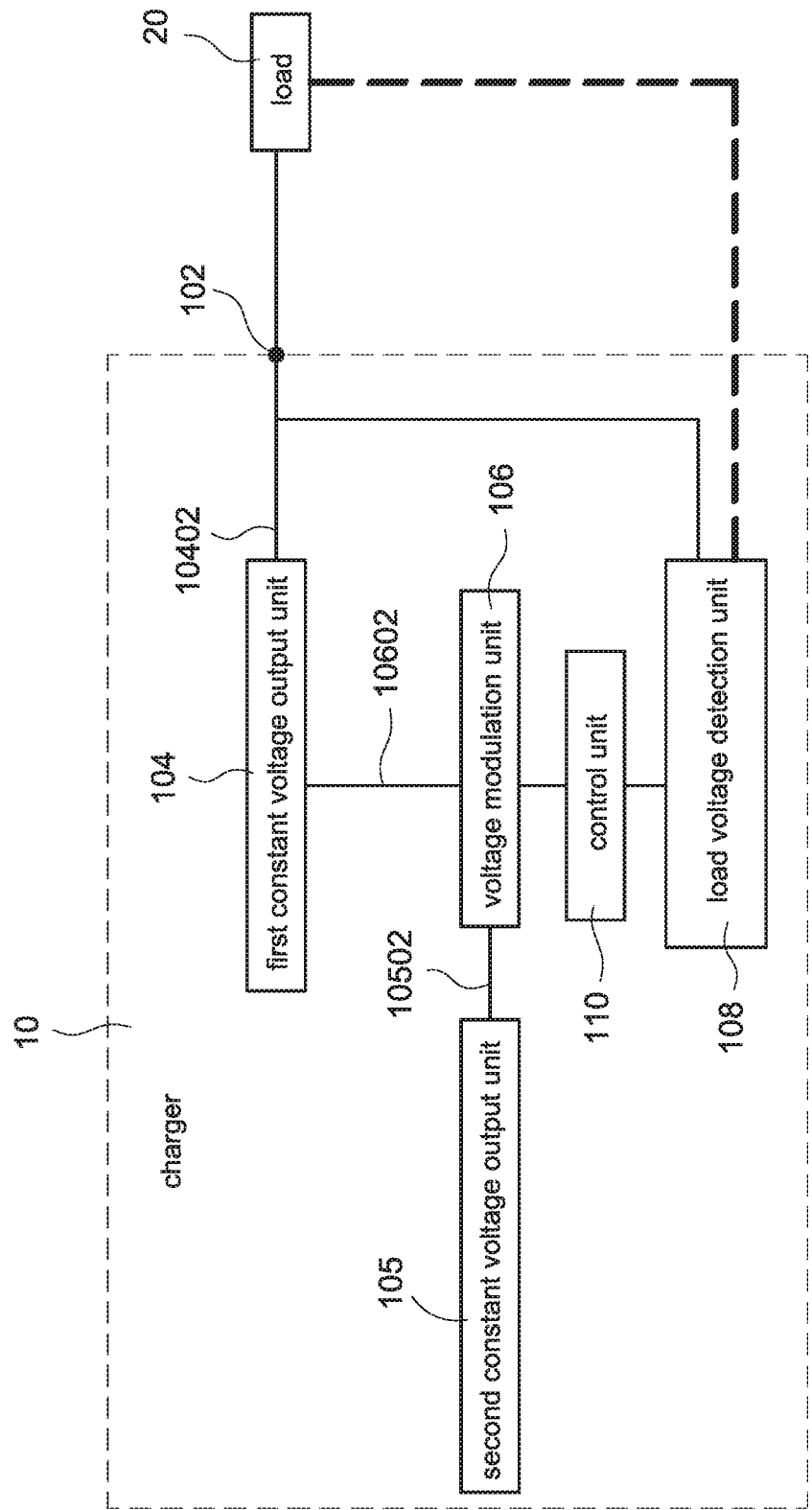
FIG. 2 shows a block diagram of the second embodiment of the charger with the wide range output voltage of the present invention.

FIG. 2 shows a block diagram of the second embodiment of the charger with the wide range output voltage of the present invention. A charger 10 with a wide range output voltage is used to charge a load 20. The charger 10 includes a voltage output side 102, a first constant voltage output unit 104, a voltage modulation unit 106, a second constant voltage output unit 105, a load voltage detection unit 108 and a control unit 110. The voltage modulation unit 106 is electrically connected to the first constant voltage output unit 104, the second constant voltage output unit 105 and the control unit 110. The voltage output side 102 is electrically connected to the first constant voltage output unit 104, the load voltage detection unit 108 and the load 20. The load voltage detection unit 108 is further electrically connected to the load 20 and the control unit 110. In FIG. 2, the dash line between the load 20 and the load voltage detection unit 108 is the signal line.

The main technical features of FIG. 2 of the present invention are similar to the main technical features of FIG. 1, so it would be omitted here for brevity. The difference is that the load voltage detection unit 108 detects a load voltage of the load 20 and transmits the load voltage of the load 20 to the voltage modulation unit 106 through the control unit 110 (namely, the load voltage detection unit 108 informs the voltage modulation unit 106 of the load voltage of the load 20 through the control unit 110), and the load 20 informs the control unit 110 of a load charging voltage requirement of the load 20 through the load voltage detection unit 108.

Figure 3:
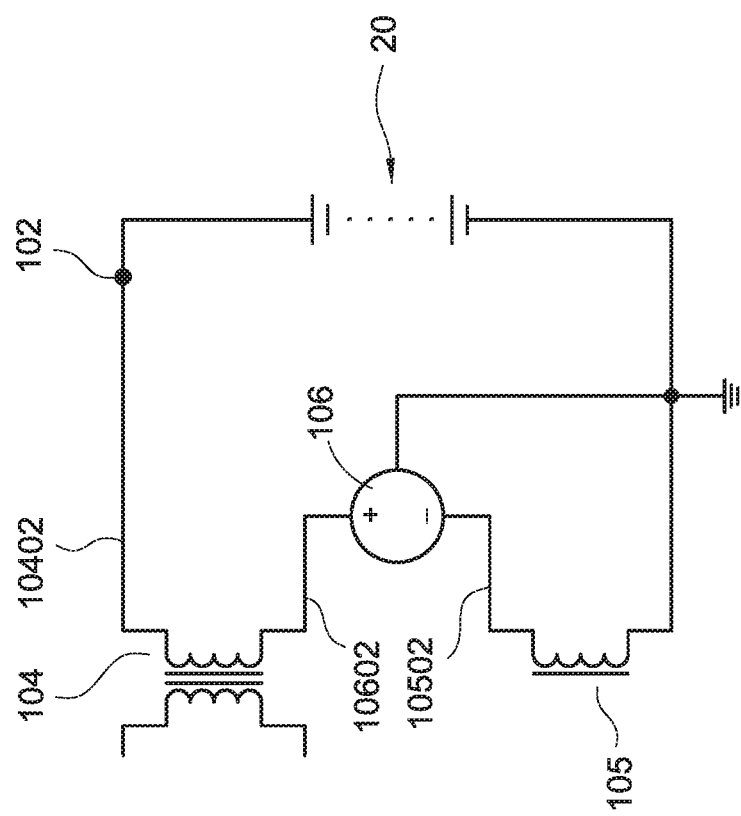
FIG. 3 shows a circuit diagram of a roughly part of an embodiment of the charger with the wide range output voltage of the present invention.

FIG. 3 shows a circuit diagram of a roughly part of an embodiment of the charger with the wide range output voltage of the present invention. The present invention is not limited by FIG. 3. As shown in FIG. 3, the first constant voltage output unit 104 is a secondary side first winding of a transformer. The second constant voltage output unit 105 is a secondary side second winding of the transformer. In an embodiment, the first constant voltage 10402 is 4.5 volts. The second constant voltage 10502 is 4.5 volts. The modulation voltage 10602 is 0.45 volts~9 volts (namely, in this embodiment, the modulation voltage 10602 is 0.1~2 times of the second constant voltage 10502). The voltage of the voltage output side 102 (namely the first constant voltage 10402 adding to the modulation voltage 10602) is 4.95 volts~13.5 volts, which is wider than the output voltage range (6 volts~9 volts) of the related art charger mentioned above.

Figure 4:
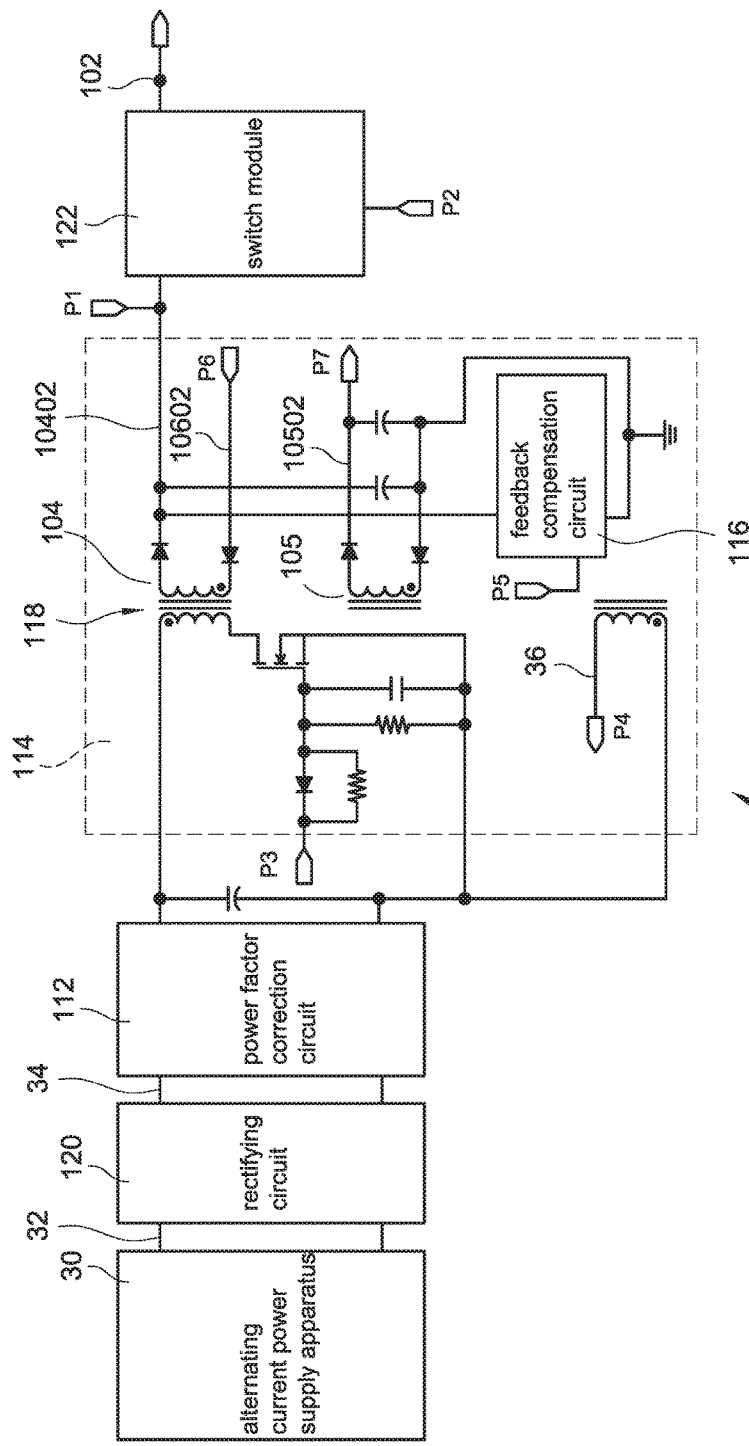
FIG. 4 shows a circuit block diagram of a part of an embodiment of the charger with the wide range output voltage of the present invention.

FIG. 4 shows a circuit block diagram of a part of an embodiment of the charger with the wide range output voltage of the present invention. Please refer to FIGS. 1~3 again. Moreover, the charger 10 is connected to an alternating current power supply apparatus 30 to receive an alternating current power 32. The charger 10 at least further comprises a rectifying circuit 120, a power factor correction circuit 112, a main circuit 114, a switch module 122, a first point P1, a second point P2 and a third point P3. The main circuit 114 at least comprises a feedback compensation circuit 116, a main isolating transformer 118, a fourth point P4, a fifth point P5, a sixth point P6 and a seventh point P7.

The rectifying circuit 120 is used to rectify the alternating current power 32 to obtain a direct current power 34. Then, the power factor correction circuit 112 compensates a voltage phase and a current phase of the direct current power 34. In a primary side of the main isolating transformer 118, the main isolating transformer 118 outputs an auxiliary power 36 through the fourth point P4 to supply working voltages to integrated circuits of the main circuit 114. In a secondary side of the main isolating transformer 118, the first constant voltage output unit 104 outputs the first constant voltage 10402. The second constant voltage output unit 105 outputs the second constant voltage 10502 to the seventh point P7 (continuing to FIG. 5 to describe in details later). When the switch module 122 is turned on (the timing of being turned on would be described in details later), the charger 10 utilizes the first constant voltage 10402 adding the modulation voltage 10602 to charge the load 20. The main circuit 114 shown in FIG. 4 is the Flyback structure, but when an output power of the charger 10 is greater than 75 W, the main circuit 114 often uses the LLC resonance structure, the full bridge structure or the Forward structure to replace the Flyback structure.

Figure 5:
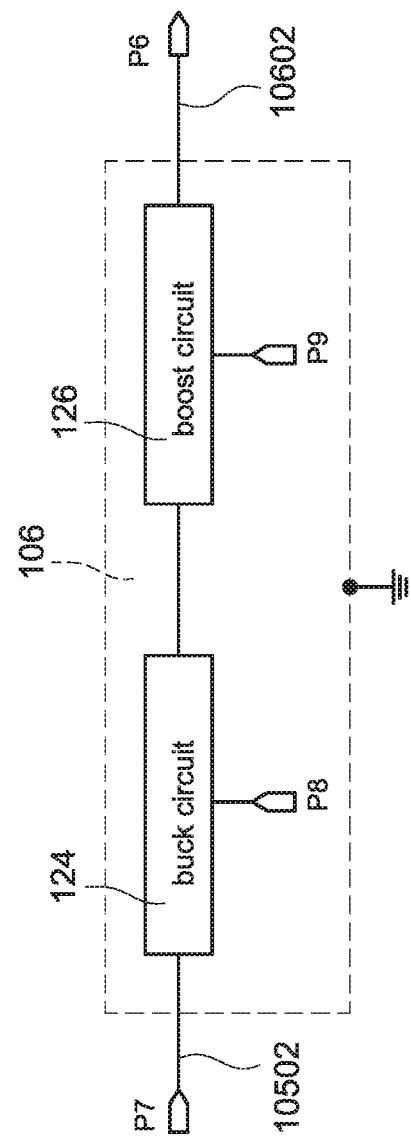
FIG. 5 shows a block diagram of an embodiment of the voltage modulation unit of the present invention.

FIG. 5 shows a block diagram of an embodiment of the voltage modulation unit of the present invention. Please refer to FIGS. 1~4 again. The voltage modulation unit 106 comprises a buck circuit 124, a boost circuit 126, an eighth point P8 and a ninth point P9. Continuing from the description of FIG. 4, the buck circuit 124 receives the second constant voltage 10502 through the seventh point P7, and cooperates with the boost circuit 126 to perform a boost-buck process for the second constant voltage 10502 to obtain the modulation voltage 10602. Namely, the buck circuit 124 and the boost circuit 126 are configured to buck or boost the second constant voltage 10502 to obtain the modulation voltage 10602. Then, the voltage modulation unit 106 outputs the modulation voltage 10602 through the sixth point P6 (as shown in FIG. 4).

Figure 6:
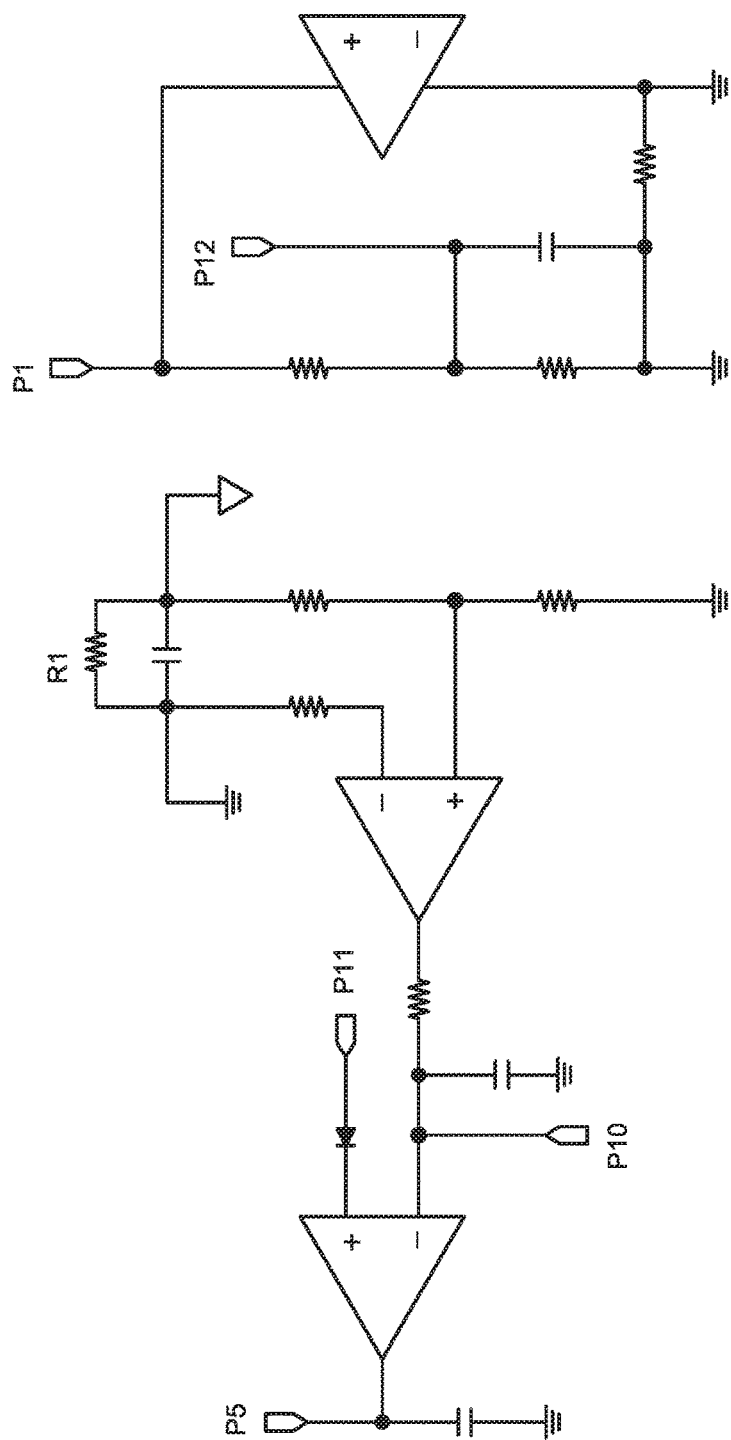
FIG. 6 shows a circuit diagram of an embodiment of the control unit and its peripheral circuits of the present invention.

FIG. 6 shows a circuit diagram of an embodiment of the control unit and its peripheral circuits of the present invention. Please refer to FIGS. 1~5 again. The control unit 110 at least comprises a current detecting resistor R1, a tenth point P10, an eleventh point P11 and a twelfth point P12. When the load 20 (for example, the battery module) is connected to the charger 10, first the control unit 110 reads a voltage of each of a plurality of battery cells of the battery module, and the battery module provides a voltage signal to the control unit 110, so that through the third point P3 shown in FIG. 4, the charger 10 is configured to control to turn on a charging power (namely, the first constant voltage 10402 and the modulation voltage 10602) to be transmitted to the battery module. After the battery module utilizes internal integrated circuits to detect that the battery cells are normal, the battery module sends out a corresponding value to the control unit 110, so that the control unit 110 sends control signals to the buck circuit 124 and the boost circuit 126 through the eighth point P8 and the ninth point P9 shown in FIG. 5 respectively to control the buck circuit 124 and the boost circuit 126 to adjust the second constant voltage 10502 to obtain the modulation voltage 10602. The control unit 110 and its peripheral circuits detect a voltage value of the voltage output side 102 through the twelfth point P12 shown in FIG. 6 and the voltage value of the voltage output side 102 is sent to the control unit 110. Then the control unit 110 controls the switch module 122 shown in FIG. 4 to be turned on through the second point P2 shown in FIG. 4 to charge the load 20.

Moreover, the control unit 110 controls an initial value of a charging current through the tenth point P10 shown in FIG. 6, wherein the charging current charges the load 20. When the battery module is charged, the following data would be instantaneously sent to the control unit 110 to determine to control the charging current and to monitor statuses of the battery cells:

1. A voltage value of each of the battery cells.
2. The current detecting resistor R1 shown in FIG. 6 detects the charging current and feedbacks to the control unit 110. A pulse width modulation signal which controls the charging current is adjusted through the eleventh point P11 shown in FIG. 6.

The advantage of the present invention is that the output voltage of the charger is a wide range voltage, so that the application range of the charger becomes wide (namely big).

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A charger with a wide range output voltage comprising:
   a voltage output side;
   a first constant voltage output unit electrically connected to the voltage output side, and the first constant voltage output unit generating a first constant voltage;
   a voltage modulation unit electrically connected to the first constant voltage output unit; and
   a load voltage detection unit electrically connected to the voltage output side, the first constant voltage output unit and the voltage modulation unit, and the load voltage detection unit detecting a load voltage and transmitting the load voltage to the voltage modulation unit,
   wherein according to the load voltage and a load charging voltage requirement, the voltage modulation unit generates a modulation voltage and transmits the modulation voltage to the first constant voltage output unit; the first constant voltage output unit transmits the first constant voltage and the modulation voltage to the voltage output side;
   wherein the modulation voltage is an n times of a second constant voltage; the n is a positive number.

2. The charger in claim 1 further comprising:
   a second constant voltage output unit electrically connected to the voltage modulation unit to supply the second constant voltage to the voltage modulation unit.

3. The charger in claim 2, wherein the second constant voltage output unit is an alternating-current-to-direct-current power conversion circuit receiving an external alternating current power, or the second constant voltage output unit is an external direct current power.

4. The charger in claim 2, wherein the second constant voltage output unit is a power conversion circuit receiving an internal alternating current power.

5. The charger in claim 1, wherein the voltage modulation unit is a buck-boost circuit.

6. The charger in claim 1, wherein the load voltage detection unit comprises a control unit; according to the load charging voltage requirement, the control unit controls the voltage modulation unit to generate the modulation voltage.

7. The charger in claim 1 further comprising:
   a control unit electrically connected to the voltage modulation unit and the load voltage detection unit,
   wherein the load voltage detection unit informs the control unit of the load charging voltage requirement; according to the load charging voltage requirement, the control unit controls the voltage modulation unit to generate the modulation voltage.

8. The charger in claim 1, wherein a range of the n is between 0.1 and 10.

* * * * *